(12) United States Patent
Asikainen et al.

(10) Patent No.: US 6,853,224 B2
(45) Date of Patent: Feb. 8, 2005

(54) METHOD AND DEVICE FOR IMPROVING EFFICIENCY OF FREQUENCY SYNTHESIZER

(75) Inventors: Kalle Asikainen, Pirkkala (FI); Sami Rintamäki, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/150,600

(22) Filed: May 17, 2002

(65) Prior Publication Data

US 2003/0001681 A1 Jan. 2, 2003

(30) Foreign Application Priority Data

Jun. 29, 2001 (FI) .............................................. 20011422

(51) Int. Cl.[7] .............................................. H03L 7/06
(52) U.S. Cl. ........................................ 327/157; 331/18
(58) Field of Search ................................ 327/3, 5, 7, 8, 327/12, 148, 156, 157, 162; 331/18, 25; 375/374, 375, 376

(56) References Cited

U.S. PATENT DOCUMENTS

| | | | | |
|---|---|---|---|---|
| 4,843,332 A | | 6/1989 | Cok et al. ...................... 327/8 |
| 4,952,889 A | * | 8/1990 | Irwin et al. .................. 332/128 |
| 5,055,803 A | * | 10/1991 | Hietala ......................... 331/17 |
| 5,952,853 A | | 9/1999 | Willingham et al. ........... 327/8 |
| 6,100,721 A | | 8/2000 | Durec et al. .................... 327/3 |
| 6,329,847 B1 | * | 12/2001 | Chabas ........................... 327/3 |

* cited by examiner

Primary Examiner—Linh My Nguyen
(74) Attorney, Agent, or Firm—Harrington & Smith, LLP

(57) ABSTRACT

A method and a device for reducing cycle slips resulting from frequency hops in a wireless communication device. In the method, a first signal pulse is received, which first signal pulse is either said reference signal pulse or said signal pulse to be compared, a second signal pulse is received, which second signal pulse is from another source than said first signal pulse, a control voltage is generated for controlling a voltage controlled oscillator in response to a phase difference between said first received and said second received signal pulses. At a time instant between the reception of said first and said second signal pulses, a constant voltage is added to said control voltage on receiving additionally one signal pulse, which is the same type as said first signal pulse. After receiving said second signal pulse, said constant voltage is removed from said control voltage on receiving at least one signal pulse, which is the same type as said second signal pulse.

13 Claims, 10 Drawing Sheets

US 6,853,224 B2

METHOD AND DEVICE FOR IMPROVING EFFICIENCY OF FREQUENCY SYNTHESIZER

FIELD OF THE INVENTION

The present invention relates to a method and a device for improving the efficiency of a frequency synthesizer, and particularly but not necessarily, for reducing cycle slips in connection with frequency hops.

BACKGROUND ART

Because of new TDMA (Time Division Multiple Access) and TDD (Time Division Duplex) standards, such as HSCSD, GPRS, WCDMA/TDD and Bluetooth, determining a signal settling time has a key role in wireless communications systems. In said standards, a time window between a TX slot and an RX slot is getting shorter and shorter.

Transceivers in radio-frequency communications systems, such as mobile systems, employ frequency synthesizers for generating a radio-frequency signal. Previous implementations have employed a so-called integer-N synthesizer, in which a feedback divider divides a frequency arriving in a phase detector by an integer N. When the divider input has received N pulses, the output provides one pulse.

The frequency synthesizer 100 of FIG. 1a, such as an integer-N synthesizer, as well as a fractional-N synthesizer to be presented below, comprises a phase lock loop (references 101 to 104) (PLL), i.e. a feedback control system, which further comprises a divider 104 for dividing an output signal frequency of a voltage controlled oscillator 103, a phase detector 101 for generating a control signal to the voltage controlled oscillator 103 in response to a phase difference between a reference signal and the signal coming from the divider 104, a loop filter 102 for filtering said control signal into control voltage, and for providing the output frequency of the voltage controlled oscillator (VCO) 103 on the basis of the received control voltage. The PLL frequency synthesizer also comprises a reference frequency source, which can be e.g. a temperature-compensated crystal oscillator, and a divider 104 control 105 for implementing the division of the VCO frequency.

FIG. 2a shows a simplified phase detector 101 of a frequency synthesizer, i.e. a phase frequency detector (PFD), which phase detector may comprise a D flip-flop 201 for detecting a reference pulse and a second flip-flop for detecting a VCO pulse and a reset means 207, e.g. an AND gate, by means of which the flip-flops 201 and 202 are reset, when an opposite pulse arrives in the phase detector. The phase detector 101 is generally followed by a charge-pump-type current source (203, 204) and a loop filter 102, which may comprise a resistor 205 and a capacitor 206, by which the current pulses generated by the charge pumps are converted to control voltage. PFD compares phase difference between two incoming signals Ref and VCO, and as presented in FIG. 2b provides the output of the flip-flop 201 with an up-pulse U, which controls the charge pump 203 to generate a current pulse $I_U$, when the reference frequency $f_{Ref}$ exceeds the compared frequency $f_{VCO}$. Correspondingly, the output of the flip-flop 202 is provided with a down-pulse D, which controls the charge pump 204 to generate a current pulse $I_D$, when the reference frequency $f_{Ref}$ is lower than the compared frequency $f_{VCO}$. The length of said up- or down-pulse in time is proportional to the phase difference between two incoming signals. The current pulse is integrated to be voltage in the loop filter according to a transfer function F(s) of the loop filter 102. The provided direct voltage $V_{VCO}$ is used for controlling the frequency of a local oscillator. The magnitude of the currents $I_U$ and $I_D$ is constant during the pulse, but the charge (Q=i*t) integrated in the pulse changes. Because the linear operating range of the phase detector is ±2π, the maximum current pulse width is obtained when the phase difference is 2π. If the incoming phase difference exceeds 2π, the current pulse width changes to its lowest value in a manner presented in FIG. 3a, whereby the phase comparison range becomes non-linear.

A fractional-N synthesizer differs from the integer-N synthesizer in that a frequency arriving in the phase detector 101 is generated on an alternating principle between two different frequencies. In the fractional-N synthesizer, the employed reference frequency is generally higher than in the integer-N synthesizer, because the output frequency resolution can be lower than the reference frequency. A higher reference frequency is an advantageous feature of the synthesizer output in view of interference and noise levels, which, on one hand, allows the use of a large loop band width and thus reduces the synthesizer settling time in a frequency hop. On the other hand, to reduce the noise band width of the phase lock loop and to attenuate a phase comparison frequency the phase-locked loop should have as narrow a band as possible, which enhances the stability of the loop. However, a narrow band delays the loop, which means an increase in the settling time in the frequency synthesizer.

In order to be able to utilize the fractional-N synthesizer technology in an optimal manner as a fast settling synthesizer solution, cycle slips, which result from a typically high phase comparison frequency of the fractional-N synthesizer, are to be avoided. In current solutions cycle slips occur when the phase difference between the signals to be compared exceeds the linear operating range of the phase detector, which operating range in current technology generally is ±2π. FIG. 1b shows signal settling on transferring from frequency $f_1$ to frequency $f_2$, when there is no cycle slip. This situation prevails, when the phase difference between the signals to be compared is less than 2π. However, a high comparision frequency may cause cycle slips, like those presented in FIG. 1c, in the signal settling, particularly in large frequency hops, which further increases the settling time of the frequency synthesizer.

U.S. Pat. No. 6,100,721 discloses a solution for extending the variation range of a phase detector used in connection with a frequency synthesizer, such as an integer-N synthesizer, to exceed the commonly used ±2π. Said publication sets forth a phase detector, which comprises a first pair of D flip-flops for detecting a phase difference between an input frequency and a reference frequency. Said first pair of flip-flops controls two first current sources of a charge pump to generate an error signal, which error signal controls a voltage controlled oscillator to generate an oscillator signal, whose frequency is D times the reference frequency and in which D is typically an integer (e.g. 1,000). The phase detector also comprises a second pair of D flip-flops, which detects when the input frequency is more than 2π ahead of or behind the reference frequency. The second pair of flip-flops is implemented to increase or decrease a counter value, the counter in turn controlling additional current sources of the charge pump. The additional current sources extend the linear operating range of the error signal, when the phase difference exceeds +2π, or correspondingly, is less than −2π. When the phase detector is in state, which corresponds to a phase comparison range of −2π, +2π, only two first current sources form a control signal. When the phase difference exceeds 2π, the counter value is increased, and in response to the increased value an additional current source is turned on, whereby a phase comparison range of 0,4π is proceeded to. Said phase comparison range is maintained until the phase difference between the input frequency and the reference frequency is again zero. Only after the phase difference between the reference signal and the compared signal has reached zero, said additional constant current is switched off, whereby a phase comparison range of −2π,+2π is returned to.

SUMMARY OF THE INVENTION

A different method and a device have now been invented for reducing cycle slips and for increasing a variation range of a phase detector to exceed the commonly used ±2π. In the method, a linear range [−2 pi,+2 pi] of a phase comparator is formed by a first pair of flip-flops, such as a pair of d flip-flops, in the same manner as in the prior art publication U.S. Pat. No. 6,100,721. Additionally, in the method, a linear range [2 pi,4 pi] or [−4 pi,−2 pi] of the phase comparator is formed by a second pair of flip-flops after exceeding the phase difference 2 pi, unlike in said prior art publication, in which said second pair of flip-flops is used for changing a value of a counter. From the range [2 pi,4 pi] or [−4 pi,−2 pi], a normal state within the linear range [−2 pi,2 pi] is returned to as soon as the phase difference is back less than 2 pi. The method reduces the number of cycle slips and improves the performance of a transmitter-receiver device, such as mobile station, as the signal settling time of a frequency synthesizer becomes shorter.

In current mobile stations, the signal settling time is about 100 to 300 μs, whereas if the operation of the synthesizer is improved by increasing the variation range of the phase detector in accordance with the invention, it is possible to achieve a shorter settling time of an output signal frequency than currently. The shorter frequency synthesizer settling time implemented by the method of the invention, for instance in a mobile station, provides a possibility of power consumption optimisation in generating a transmitted signal, because power supply to the frequency synthesizer and to the voltage controlled oscillator (VCO) can be temporarily turned off, e.g. between TX slots and RX slots, and turned on just before the operation of the local oscillator is needed again.

A first aspect of the invention implements a method for reducing cycle slips in a frequency synthesizer, the frequency synthesizer comprising a voltage controlled oscillator for generating an output signal frequency, a divider for dividing said output signal into a signal pulse to be compared, a reference oscillator for generating a reference signal pulse and means for generating control voltage for the voltage controlled oscillator in response to a detected phase difference, which phase difference is the phase difference between the signal pulse to be compared and the reference signal pulse, and the method comprising the steps of receiving a first first-type signal pulse, the first-type signal pulse being either said reference signal pulse or said signal pulse to be compared, receiving a second second-type signal pulse, the second-type signal pulse being either said reference signal pulse or said signal pulse to be compared but of a different type than said first signal pulse, generating control voltage for controlling the voltage controlled oscillator in response to a phase difference between said first signal pulse and said second signal pulse, the magnitude of the phase difference being within the range of 0 to 2π, increasing the control voltage for a degree of constant voltage at a time instant between the reception of said first signal pulse and said second signal pulse, on receiving also a third signal pulse, which is of the first type, characterized in that in the method, after reception of said second signal pulse, before reception of a fourth signal pulse, which fourth signal pulse is of the first type, said control voltage is reduced for a degree of said constant voltage, on receiving at least one fifth signal pulse, which is of said second type.

A second aspect of the invention implements a device for reducing cycle slips resulting from frequency hops in a communication device, which device comprises a voltage controlled oscillator for generating an output signal frequency, a divider for dividing said output signal into a signal pulse to be compared, a reference oscillator for generating a reference signal pulse, and the device comprises means for generating control voltage for the voltage controlled oscillator in response to a detected phase difference, the phase difference being a phase difference between the signal pulse to be compared and the reference signal pulse, and the device comprises receiving means for receiving a first first-type signal pulse, the first signal pulse being either said reference signal pulse or said signal pulse to be compared, receiving means for receiving a second second-type signal pulse, the second signal pulse being either said reference signal pulse or said signal pulse to be compared but of a different type than said first signal pulse, generating means for generating control voltage to control the voltage controlled oscillator in response to a phase difference between said first received signal pulse and said second received signal pulse, the magnitude of the phase difference being within the range of 0 to 2π, adding means for adding a constant-degree voltage to said control voltage at a time instant between the reception of said first signal pulse and said second signal pulse, on receiving also one third signal pulse, which is of said first type, characterized in that the device further comprises removing means for reducing said constant-degree voltage from said control voltage after the reception of said second signal pulse, before the reception of a fourth signal pulse, which is of said first type, on receiving at least one fifth signal pulse, which is of said second type.

A third aspect of the invention implements a wireless communication device comprising a device for reducing cycle slips resulting from frequency hops in said communication device, which device comprises a voltage controlled oscillator for generating an output signal frequency, a divider for dividing said output signal into a signal pulse to be compared, a reference oscillator for generating a reference signal pulse, and the device comprises means for generating a control voltage for the voltage controlled oscillator in response to a detected phase difference, the phase difference being a phase difference between the signal pulse to be compared and the reference signal pulse, and the device comprises receiving means for receiving a first signal pulse, the first signal pulse being either said reference signal pulse or said signal pulse to be compared, receiving means for receiving a second signal pulse, the second signal pulse being either said reference signal pulse or said signal pulse to be compared and of a different type than said first signal pulse, generating means for generating a control voltage for controlling the voltage controlled oscillator in response to a phase difference between said first signal pulse and said second signal pulse, the magnitude of the phase difference being within the range of 0 to 2π, adding means for adding a constant-degree voltage to said control voltage at a time instant between the reception of the said first signal pulse and said second signal pulse on receiving also a third signal pulse, which is of said first type, characterized in that the device further comprises removing means for reducing said constant-degree voltage from said control voltage after the reception of said second signal pulse, before the reception of a fourth signal pulse, which is of said first type, on receiving at least one fifth signal pulse, which is of said second type.

In the above-described aspects, said signal pulses from the first to the seventh do not refer to the order numbers of said pulses but they are only intended to illustrate the presentation.

BRIEF DESCRIPTION OF THE DRAWINGS

In the description of the invention reference is made to the drawings, in which.

DETAILED DESCRIPTION

The prior art was described with reference to FIGS. 1a to 3a. In the following, the invention will be described in greater detail with reference to FIGS. 3b to 6.

Figure 1A:
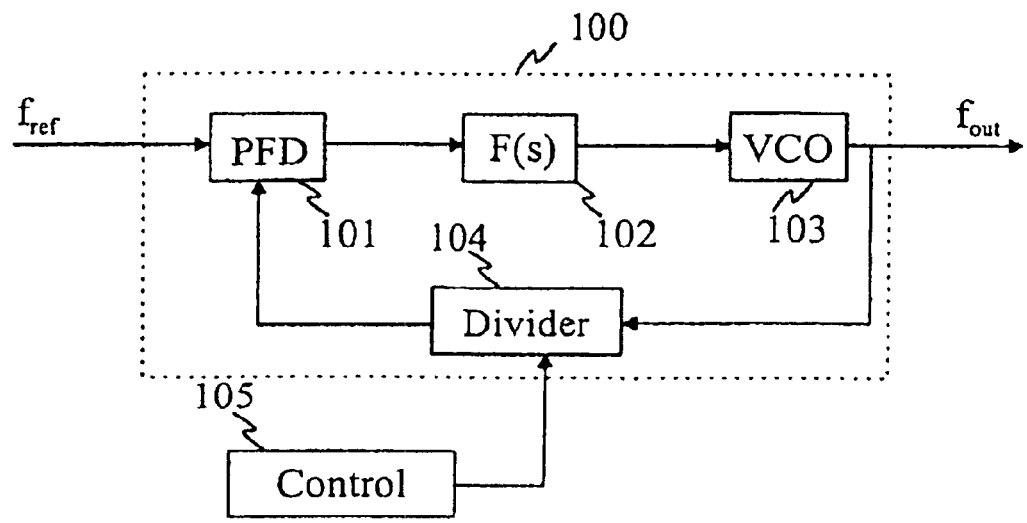
FIG. 1a is a block diagram of a prior art sigma-delta fractional-N synthesizer.
Figure 1B:
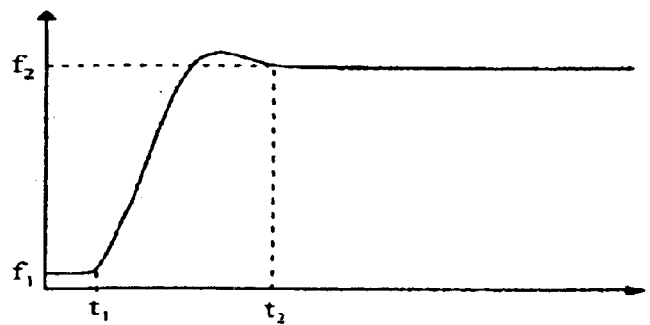
FIG. 1b shows frequency settling, when there are no cycle slips.
Figure 1C:
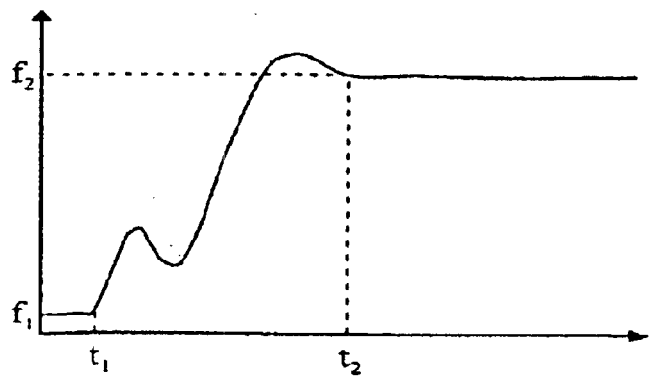
FIG. 1c shows frequency settling, when there is one cycle slip.
Figure 2A:
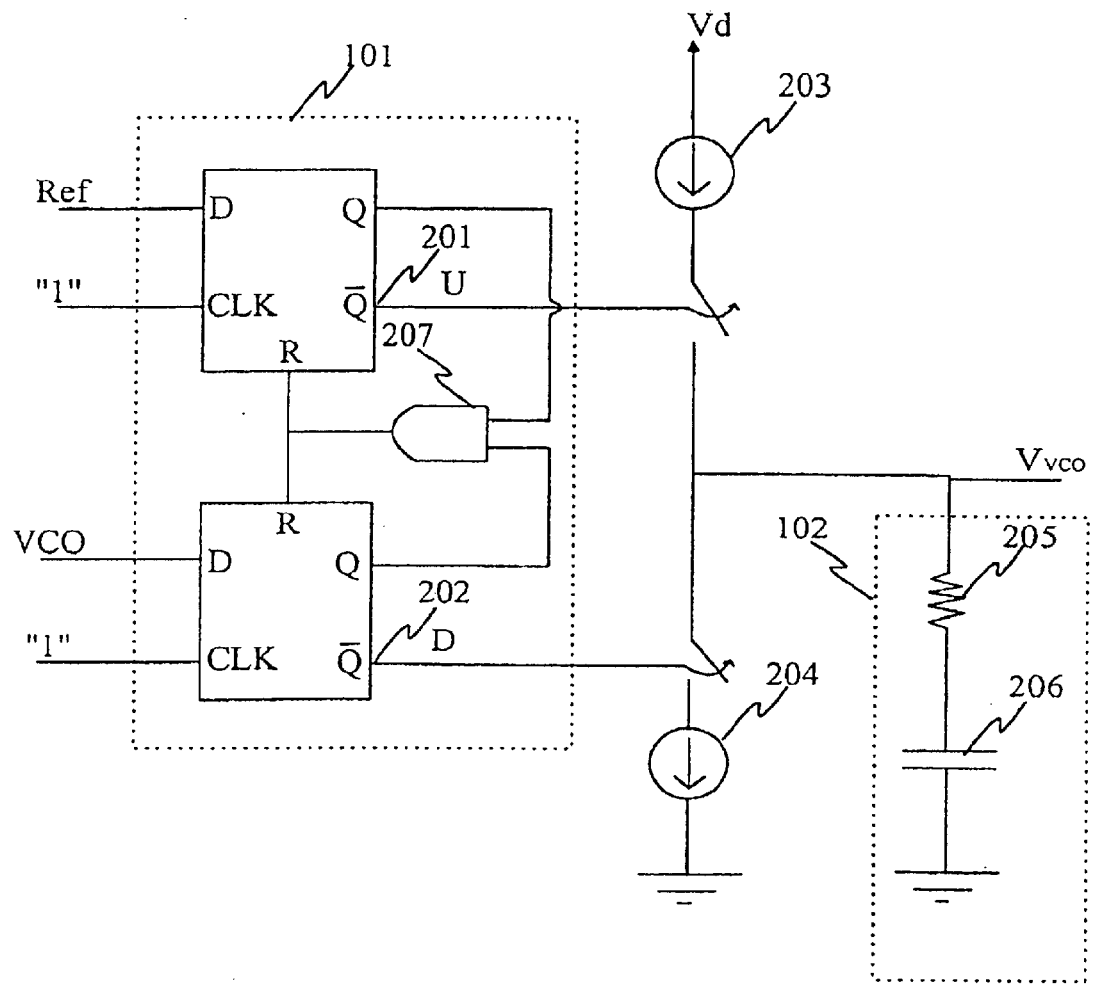
FIG. 2a shows a prior art phase detector in a simplified manner.
Figure 2B:
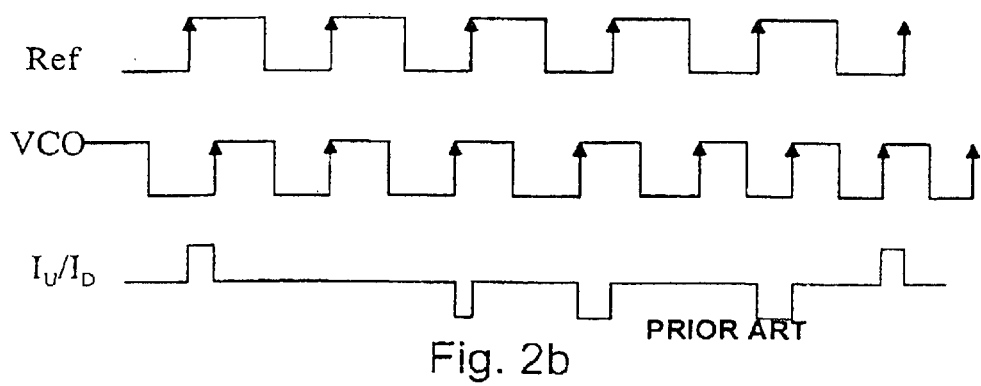
FIG. 2b shows how an output pulse generated by the phase detector is formed from a phase difference of input pulses.
Figure 3A:
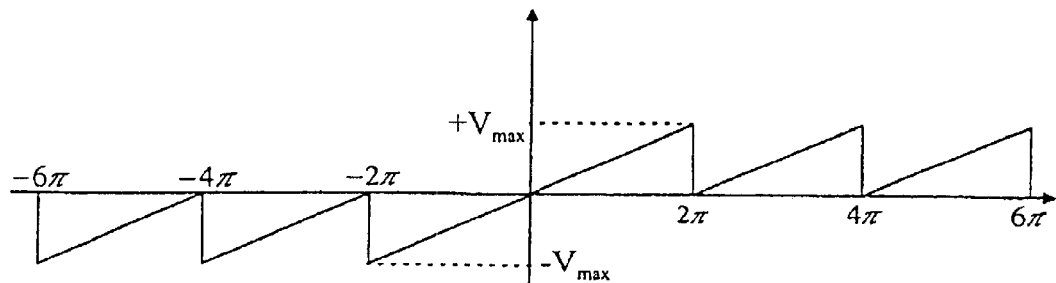
FIG. 3a shows an operating range of the prior art phase detector.
Figure 3B:
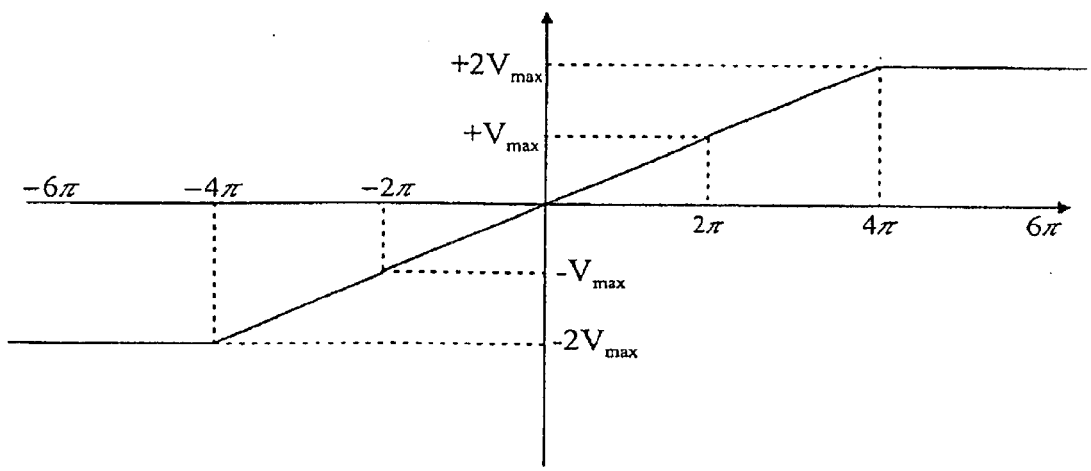
FIGS. 3b and 3c shows an operating range of the phase detector of the invention.

FIG. 3b shows an operating range of a phase detector according to one alternative embodiment of the invention. In a phase comparison range [0,2π] a first pair of charge pumps generates a first control voltage for a voltage controlled oscillator, which control voltage ($0-+V_{max}$) is proportional to a phase difference (0–2π) between a reference signal and a signal to be compared. In a phase comparison range [0,-2π] the first pair of charge pumps generates the first control voltage for the voltage controlled oscillator, which control voltage ($0--V_{max}$) is proportional to a phase difference (0–-2π) between the reference signal and the signal to be compared.

Additionally, in a phase comparison range 2π–4π a second pair of charge pumps is used for additionally generating a second control voltage, the magnitude of the second control voltage corresponding to the magnitude of said first control voltage $+V_{max}$ as the phase difference is 2π. Additionally, in a phase comparison range -4π–-2π a second pair of charge pumps is used for additionally generating a second control voltage, the magnitude of the second control voltage corresponding to the magnitude of said first control voltage $-V_{max}$ as the phase difference is -2π.

In a phase comparison range >4π the first pair of charge pumps is used for generating a control voltage for the voltage controlled oscillator, the magnitude of the control voltage being $+V_{max}$, which is equal to the control voltage when the phase difference is 2π. In addition, the second pair of charge pumps generates a constant voltage, which is also $+V_{max}$, corresponding to the magnitude of said control voltage when the phase difference is 2π. In a phase comparison range <-4π, the first pair of charge pumps is used for generating a first control voltage for the voltage controlled oscillator, the magnitude of the control voltage being equal to said control voltage when the phase difference is -2π. In addition, the second pair of charge pumps generates a second control voltage, whose magnitude also corresponds to the magnitude of said first control voltage when the phase difference is -2π.

Figure 3C:
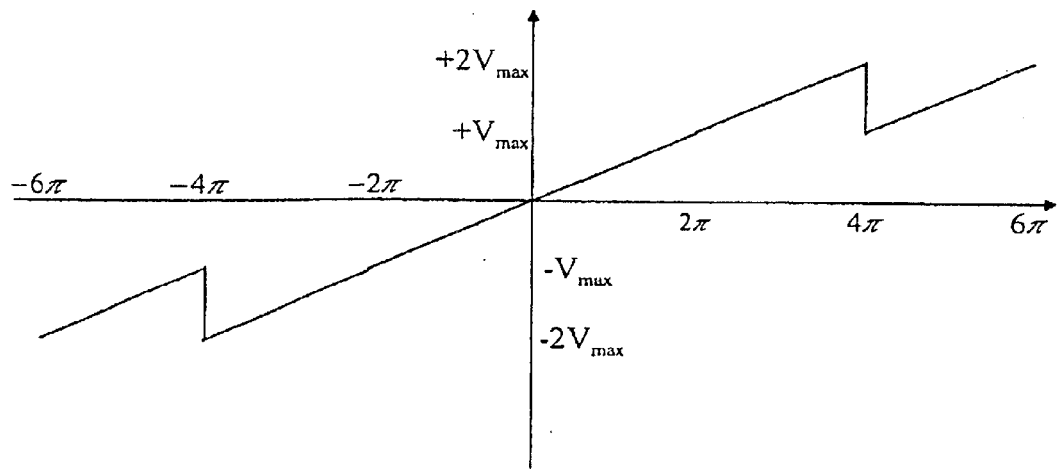

FIG. 3c shows the operating range of a phase detector according to an alternative embodiment of the invention. In a phase comparison range [0,+2π] a first pair of charge pumps generates a first control voltage for the voltage controlled oscillator, the control voltage ($0-+V_{max}$) being proportional to a phase difference (0–2π) between the reference signal and the signal to be compared. In a phase comparison range [0,-2π] a first pair of charge pumps generates a first control voltage for the voltage controlled oscillator, the control voltage ($0--V_{max}$) being proportional to a phase difference (0–-2π) between the reference signal and the signal to be compared.

Additionally, in a phase comparison range >2π and <-2π a second pair of charge pumps is used for additionally generating a second constant-degree control voltage for the voltage controlled oscillator, the magnitude of the second control voltage corresponding to the magnitude of said first control voltage $+V_{max}$ ($-V_{max}$) when the phase difference is +2π (-2π).

Figure 4:
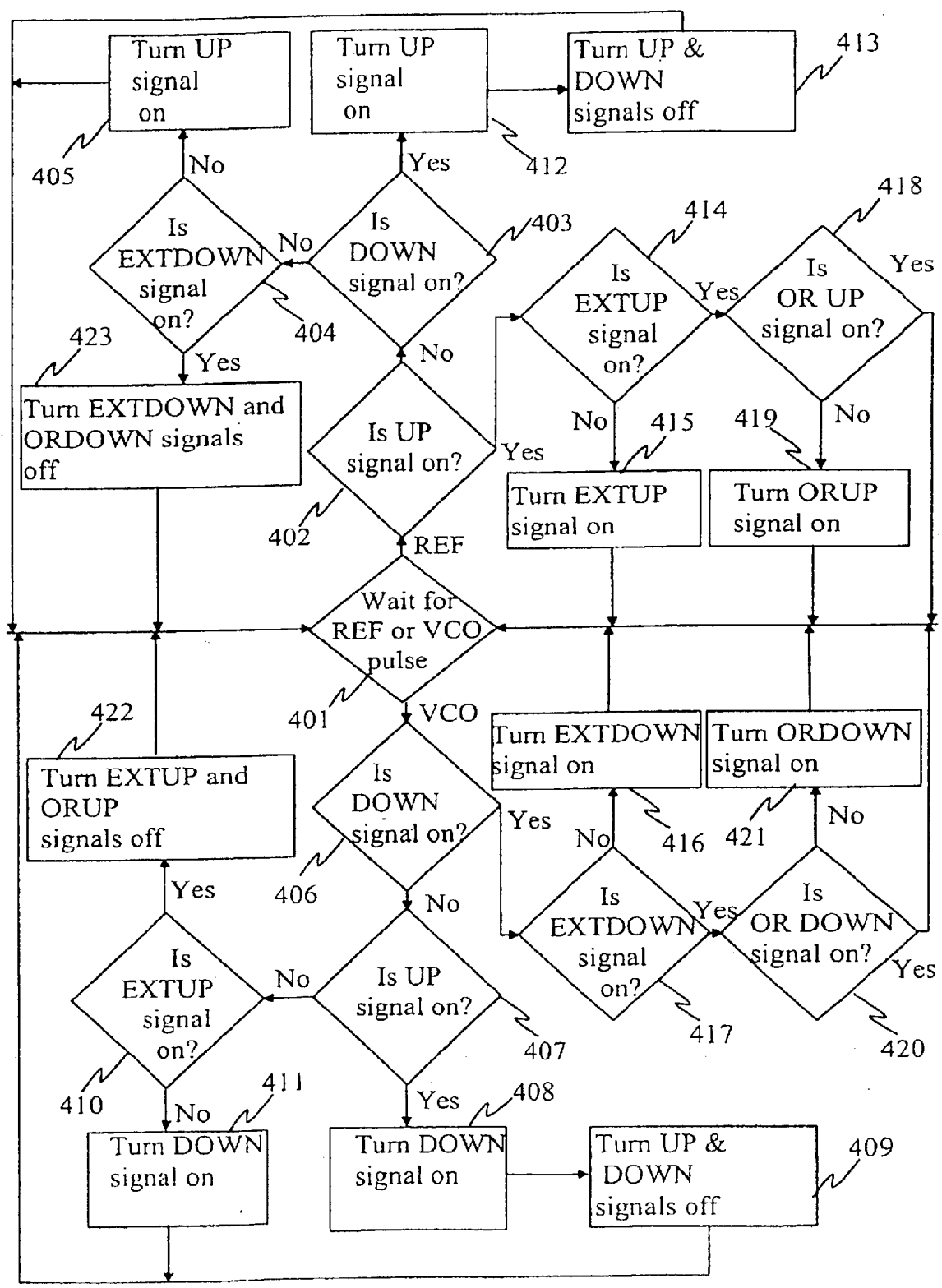
FIG. 4 is a flow chart of the method of the invention.

FIG. 4 shows a flow chart of the method according to the invention. The method monitors a phase difference between incoming signals, i.e. between the reference signal and the signal to be compared. In response to the detected phase difference, a control signal is generated for the charge pump, which control signal controls the magnitude and direction of the charge obtained from the charge pump. The control signal UP controls the charge pump 804 of the charge pump device 800 (reference numerals 800–835 are referring to FIG. 8), which charge pump generates a current pulse $I_{UP}$, which is further converted to a control voltage $U_{UP}$ in a loop filter, for instance. The control signal DOWN controls the charge pump 805 of the charge pump device 800, which charge pump generates a current pulse $I_{DOWN}$, which is further converted to a control voltage $U_{DOWN}$ in the loop filter, for instance. The control signal ORUP controls the charge pump 804 of the charge pump device 800, which charge pump generates a current pulse $I_{ORUP}$, which is further converted to a control voltage $U_{ORUP}$ in the loop filter, for instance. The control signal ORDOWN controls the charge pump 805 of the charge pump device 800, which charge pump generates a current pulse $I_{ORDOWN}$, which is further converted to a control voltage $U_{ORDOWN}$ in the loop filter, for instance. The control signal EXTUP controls the charge pump 806 of the charge pump device 800, which charge pump generates a current pulse $I_{EXTUP}$, which is further converted to a control voltage $U_{EXTUP}$ in the loop filter, for instance. The control signal EXTDOWN controls the charge pump 807 of the charge pump device 800, which charge pump generates a control voltage $I_{EXTDOWN}$, which is further converted to a control voltage $U_{EXTDOWN}$ in the loop filter, for instance.

In the following the method of the invention will be described with reference to control signals UP, DOWN, EXTUP, EXTDOWN, ORUP and ORDOWN generated by the phase detector.

The reference signal is a signal generated by a reference oscillator, whose phase and that of the signal to be compared, such as the voltage controlled oscillator signal, which is fed back and divided by a divider, are compared. The UP control signal is generated when a reference pulse, i.e. REF pulse, arrives in the phase detector before a pulse to be compared, i.e. VCO pulse. Correspondingly, the DOWN control signal is generated when the VCO pulse arrives in the phase detector before the REF pulse.

In the following (steps 401 to 409) a situation is described, where a REF pulse is received first and a VCO pulse is received second, when the phase difference is in the phase comparison range 0–2π.

In step 401, the phase detector receives one of the pulses, i.e. REF or VCO pulse. If the received pulse is REF pulse, step 402 is proceeded to, where it is examined whether UP control signal is on. If not, step 403 is proceeded to, where it is examined whether DOWN control signal is on. If DOWN control signal is not on, step 404 is proceeded to, where it is examined whether EXTDOWN control signal is on. If EXTDOWN control signal is not on, step 405 is proceeded to, where UP control signal is turned on, whereafter step 401 is proceeded to.

In step 401, a next pulse is received, which is now a VCO pulse to be compared, whereby step 406 is proceeded to, where it is examined whether DOWN control signal is on. If DOWN control signal is not on, step 407 is proceeded to for examining whether UP control signal is on. In this case UP control signal is already on, and therefore step 408 is proceeded to, where DOWN control signal is turned on, whereafter step 409 is proceeded to, where both UP control signal and DOWN control signal are turned off. Correspondingly, in a situation where the VCO pulse to be compared is received first and the REF pulse is received second, the phase difference being within a phase comparison range 0,–2π, steps 401, 406, 407, 410, 411 and steps 401, 402, 403, 412, 413 are performed.

The following describes a situation, where at least two REF pulses are received first and then a VCO pulse to be compared, when the phase difference is in the phase comparison range 2π–4π. On receiving the first REF pulse, steps 401 to 405 are performed, when UP control signal is turned on. On receiving a next REF pulse, the process proceeds through steps 401 and 402 to step 414, where it is examined whether EXTUP control signal is on, and because it is not on in said exemplary case, step 415 is proceeded to, where EXTUP control signal is turned on. EXTUP control signal provides a constant voltage $U_{EXTUP}$, which corresponds to the control voltage $U_{UP}$ when the phase difference between REF and VCO signals is 2π. On receiving VCO pulse in step 401, the process proceeds to step 406 to examine whether DOWN control signal is on. In this case it is not, and therefore step 407 is proceeded to, where it is examined whether UP control signal is on. In the case of the example both UP control signal and EXTUP control signal are on, whereby DOWN control signal is turned on in step 408 and UP control signal and DOWN control signal are turned off in step 409, whereafter step 401 is proceeded to.

Correspondingly, in a situation where two VCO pulses to be compared and one REF pulse are received, the phase difference being in said phase comparison range –2π,–4π, steps 401, 406, 407, 410 and 411 are performed in conjunction with the reception of the first VCO pulse. Steps 401, 406, 417 and 416 are performed in conjunction with the reception of the second VCO pulse.

The following describes a situation, where at least three REF pulses are received first and then a VCO pulse to be compared, the phase difference between the reference signal and the signal to be compared being >4π. On receiving the first reference pulse, UP control signal is turned on (reference numeral 405). On receiving the second REF pulse, EXTUP control signal is also turned on (reference numeral 415). ORUP control signal is turned on (reference numerals 401, 402, 414, 418, 419) when the third or more REF pulse is received in the phase detector. ORUP control signal replaces UP control signal, because the input of both pulses is in an OR gate 802 in the charge pump 800. Thus, as the phase difference exceeds 4π, at the output of the charge pump there will be a control voltage +2Vmax, which comprises the sum of the voltages $U_{ORUP}(+V_{max})$ and $U_{EXTUP}(+V_{max})$.

The following describes a situation, where the first pulse and the second pulse are received when the phase difference is less than 2π. The first received pulse is a VCO pulse to be compared and the second one is a REF pulse. In step 401, it is examined which one of the pulses is received first. Because the received pulse is the VCO pulse to be compared, step 406 is proceeded to, where it is examined whether DOWN control signal is on. If not, step 407 is proceeded to, where it is examined whether UP control signal is on. If UP control signal is not on, step 410 is proceeded to, where it is examined whether EXTUP control signal is on. If EXTUP control signal is not on, step 411 is proceeded to, where DOWN control signal is turned on. In step 401, the second pulse, which is now a REF pulse, is received, and the process proceeds to step 402, where it is examined whether UP control signal is on. If UP control signal is not on, the process proceeds to step 403 to examine whether DOWN control signal is on. In this case, DOWN control signal is on, whereby step 412 is proceeded to, where UP control signal is turned on, whereafter step 413 is proceeded to, where both UP control signal and DOWN control signal are turned off.

Figure 5:
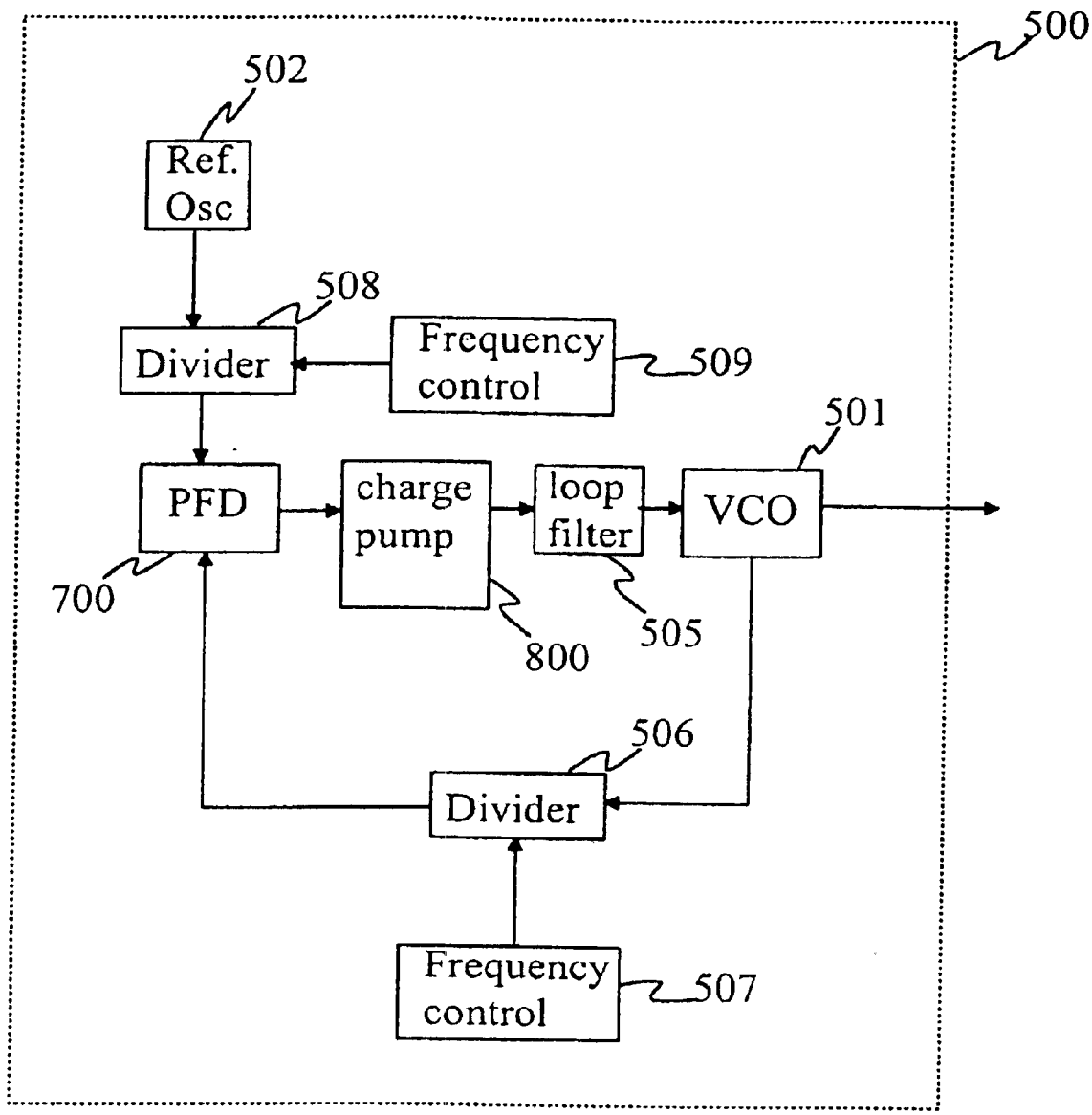
FIG. 5 is a block diagram of a frequency synthesizer of the invention.

FIG. 5 shows a block diagram of a frequency synthesizer of the invention, which frequency synthesizer is advantageously a fractional-N frequency synthesizer. The device 500 comprises a voltage controlled oscillator 501 (VCO) for generating an output signal. Said output signal is fed back to a divider 506, which divides the signal by a suitable number, such as an integer or a fraction. The divider operations are controlled by control means 507. The divided signal is received by the phase detector 700, shown in FIG. 7, which compares the phase of the divided feedback signal with the phase of a reference signal received from a reference oscillator 502. Also the output signal from the reference oscillator can be divided by the divider 508 which is controlled by control means 509. A control signal from the phase detector is applied to the charge pump 800, shown in FIG. 8, where a current pulse is generated, the magnitude of the current pulse corresponding to the detected phase difference. The current pulse is converted to control voltage in a loop filter 505, from which said control voltage is further supplied to the voltage controlled oscillator for controlling the operating frequency of said voltage controlled oscillator by means of said control voltage. The function of the loop filter 505 is to filter out alternating current components from the output signal of the phase detector 700 and to provide a pure direct voltage for the control of the voltage controlled oscillator 501.

The reference oscillator 502 provides a stable frequency reference, whose phase the phase detector 700 compares with the phase of the feedback signal received from VCO, and, by means of the charge pump 800 and the loop filter 505, produces a control voltage for VCO, which control voltage is proportional to the phase difference. By means of the control voltage VCO changes its operating frequency to the direction where the phase difference of the signals arriving in the phase detector decreases.

The phase difference having been detected, the phase detector 700 transmits a signal to the charge pump 800, which in response to the received signal generates a current pulse i, whose duration is the same as the time between the rise time starting moments of the signals to be compared. The current pulse polarity is positive or negative depending on which one of the signals is ahead of the other. For instance, if the reference signal is ahead of (or behind) VCO signal for an instant t, the phase detector sends a positive (or negative) current pulse to the charge pump. The standard charge pump receives a charge Q=+i*t (or Q=−i*t) and generates a positive (or negative) control voltage +Vd (or −Vd) and controls the frequency of VCO upward (or downward) as long as the output frequency of the divider 506 becomes the same as the reference frequency.

Figure 6:
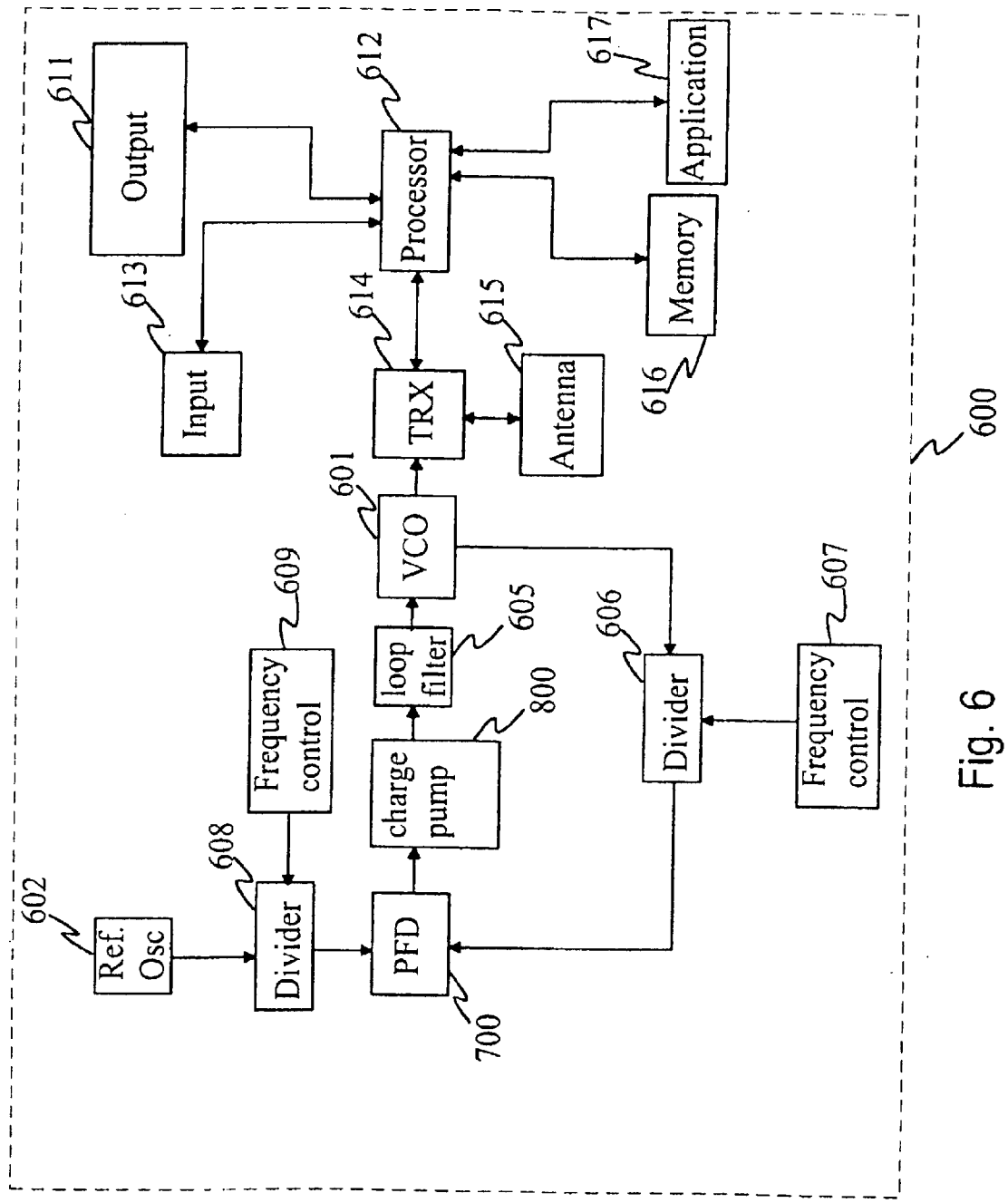
FIG. 6 is a block diagram of a communication device of the invention.

FIG. 6 shows a block diagram of a communication device according to the invention. The communication device 600 comprises output means 611 and input means 613 as shown in FIG. 6 for providing information, which means further comprise e.g. a display and a loudspeaker, by means of which the user can receive information in audiovisual form through the device or enter data in the communication device 600. The communication device may also comprise a processor 612 for executing the operations of the communication device and a memory 616 e.g. for temporary storing of a received product code, means 614, 615 for receiving information, further comprising one or more transceivers 614 and one or more antennae 615 for wireless short-range radio communication, such as Bluetooth communication, or for communicating with a mobile network, such as a GSM or GPRS mobile network. In addition, the communication device may comprise one or more applications 617 for implementing services or operations of the communication device 600.

In addition, the communication device 600 comprises a voltage controlled oscillator 601 (VCO) for generating an output signal for the transceiver 614. A reference oscillator 602 (RefO) generates a reference signal, which can be divided by a divider 608 that is controlled by control means 609. The communication device comprises a phase detector 700 (PFD), shown in FIG. 7, which compares the phase difference between said output signal and said reference signal, which phase difference is detected as a voltage pulse, which is received in the charge pump device 800, shown in FIG. 8, which further converts the voltage pulse to a constant current pulse. Said constant current pulse is filtered in a loop filter 605, which further converts the charge of the constant current pulse to a control voltage of the voltage controlled oscillator 601. The communication device 600 also comprises a divider 606 for dividing the frequency of the feedback signal from VCO and for forwarding it to the phase detector 700 and a frequency controller 607 for implementing said division.

Figure 7:
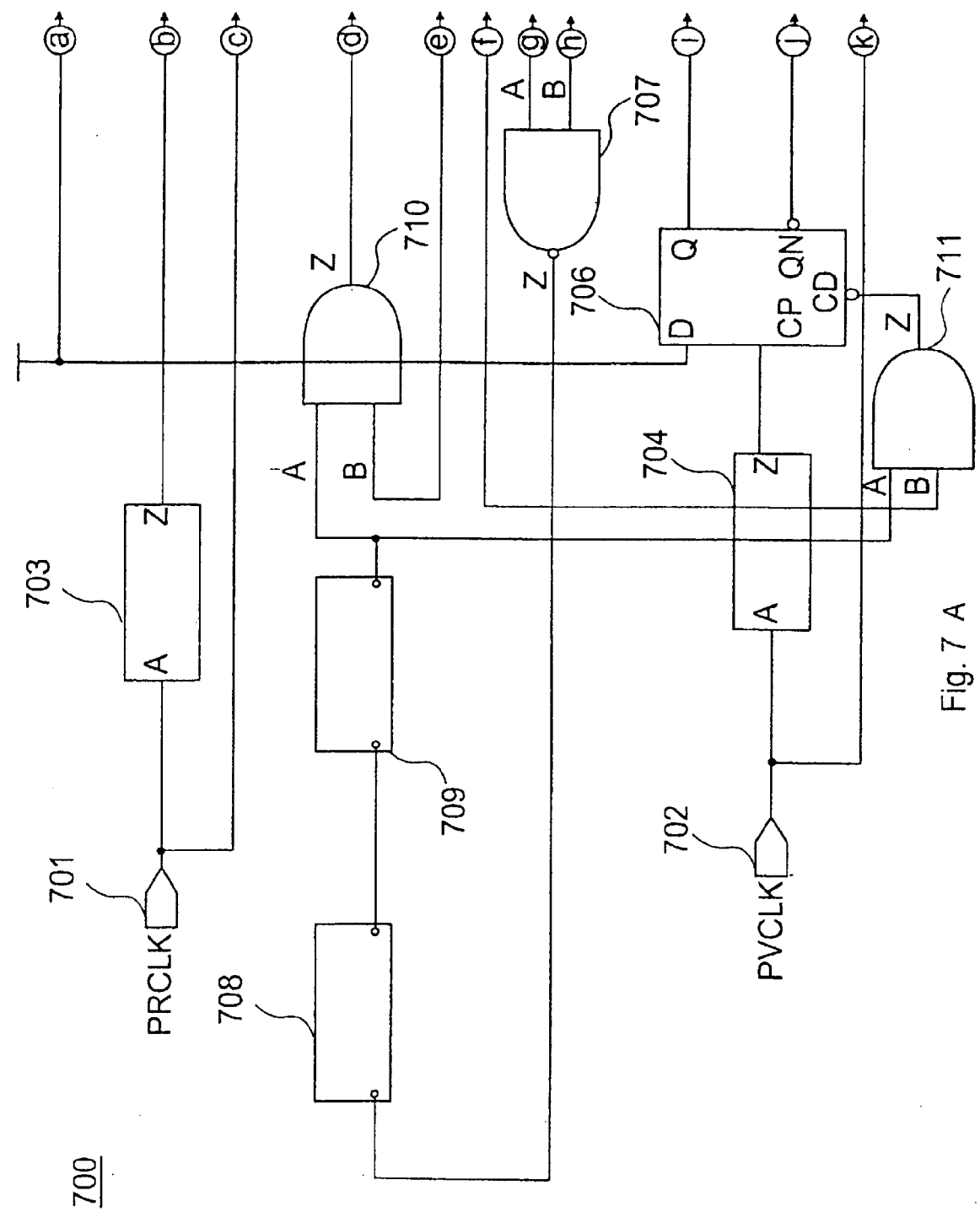
FIG. 7, shown in the drawing Figures as FIG. 7A, FIG. 7B and FIG. 7C, is a block diagram of a phase detector of the invention.
Figure 7:
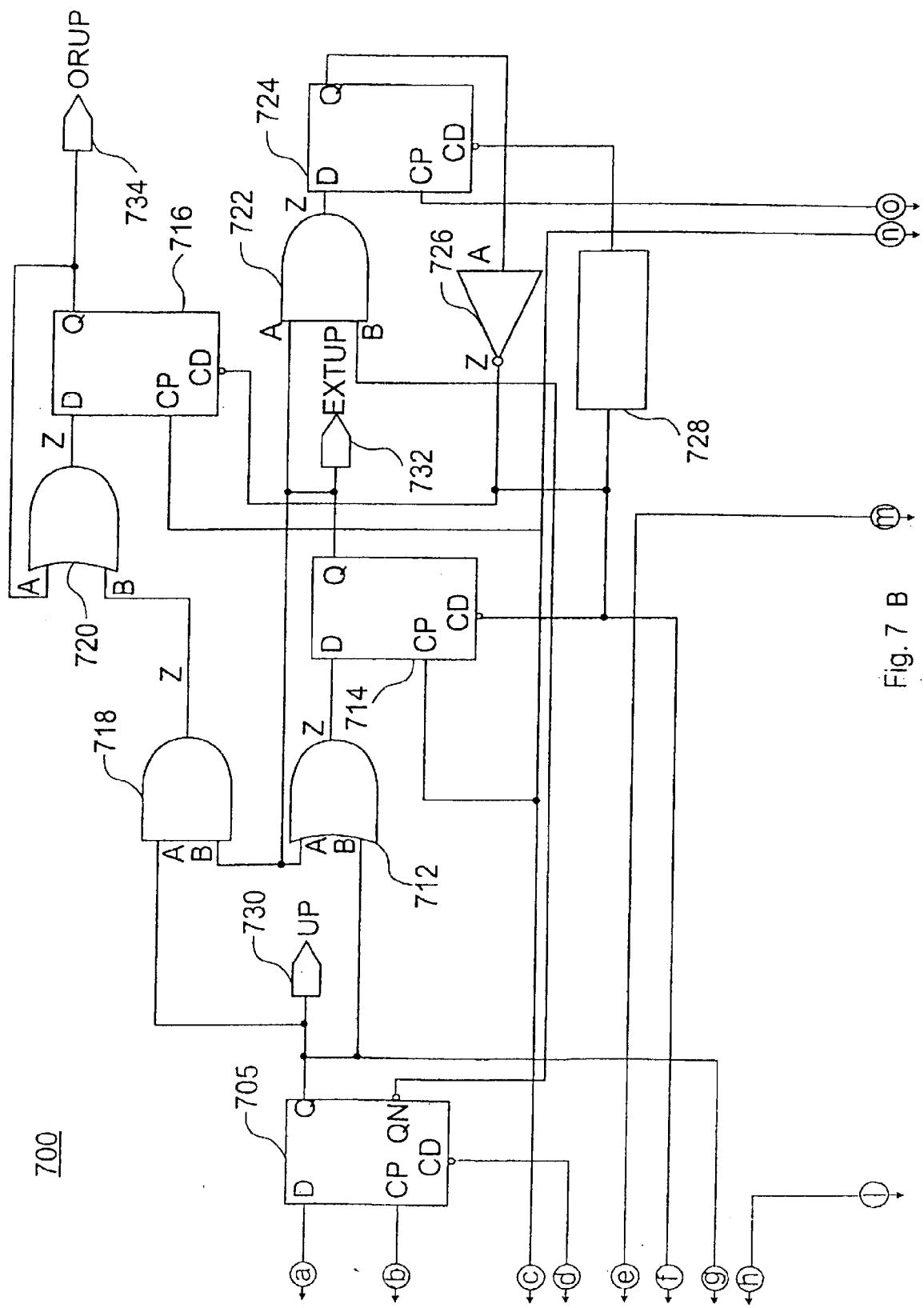
Figure 7:
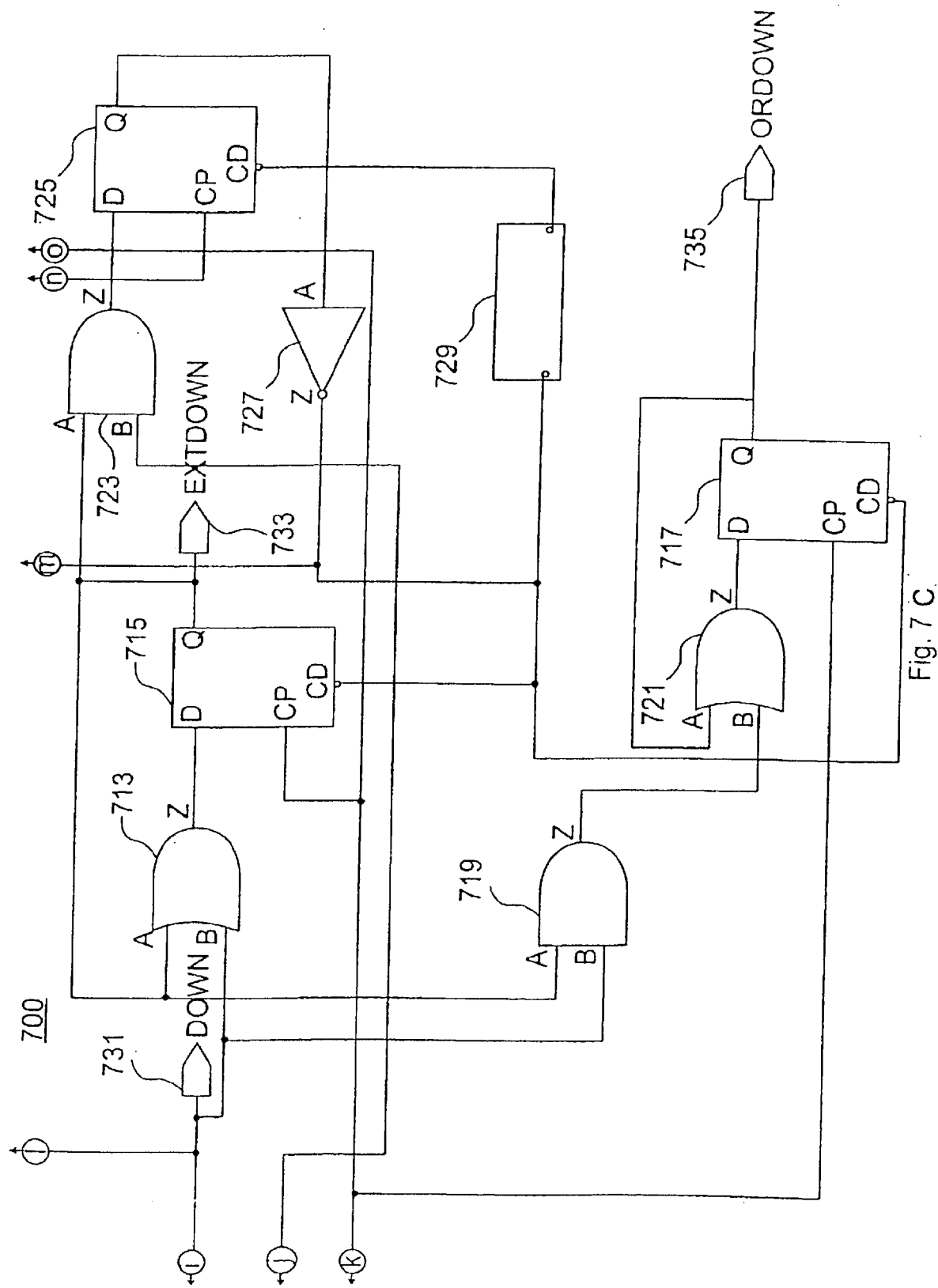

FIG. 7 shows a phase detector 700 according to one embodiment of the invention. Input PRCLK (reference numeral 701) receives a reference signal coming from the reference oscillator and input PVCLK (reference numeral 702) receives a feedback signal from VCO. Both the reference signal and said feedback signal are advantageously signals in pulse form. After inputs 701 and 702 there are short delay components (reference numerals 703 and 704), whose purpose is to prevent a reference pulse from being generated at UP or DOWN output (reference numerals 730, 731) in a situation, where the range [−2π,2π] is reverted to. At both outputs there are equal delays, so they do not affect the normal operation.

The delays are followed by first D flip-flops (reference numerals 705 and 706). When a pulse arrives in their clock input, their output (UP, reference 730/DOWN, reference 731) rises up, because their data inputs D are always in a logic one. The output of NAND gate 707 between these flip-flops falls to zero when both UP and DOWN signals are up.

The NAND gate 707 is followed by two delay cells (reference numerals 708, 709). They provide a delay, which defines a minimum width for the output pulses of the phase detector and the charge pump. The delay cells are followed by two AND gates (reference numerals 710, 711). These gates are associated with a return to the range of [−2π, 2π]. When the return is not taking place, their B inputs are up, whereby their A inputs directly define the state of their output Z. In other words, when a zero pulse from the delay cells (reference numerals 708, 709) arrives at these AND gates (reference numerals 710, 711), it goes right through and resets the D flip-flops 705 and 706.

The outputs of the first D flip-flops 705 and 706 are also connected, via OR gates (reference numerals 712, 713), to data inputs of subsequent D flip-flops (reference numerals 714, 715). The clock signal of these subsequent flip-flops comes from the same source as that of the preceding flip-flops 705 and 706. In the range of [−2π,2π] the outputs of these flip-flops (705, 706, 714, 715) are at zero, whereby the state of the preceding flip-flops 705, 706 goes right through the OR gates (reference numerals 712, 713).

When a pulse arrives in the clock input of the flip-flops 714, 715 and the output (UP/DOWN) of the preceding flip-flop 705, 706 is up, it means that two pulses have arrived in succession to one input without a pulse arriving in the other input. Then, the output (EXTUP/EXTDOWN) of these subsequent flip-flops also rises up. Now, the A input of the OR gates 712, 713 preceding these flip-flops is up, whereby the data input of the flip-flops 714, 715 is all the time up. This is because in the range of [2π,4π] the output of the preceding flip-flops is normally down as the input pulse arrives because of the reset. Without the OR gate 712, 713 the outputs of the subsequent flip-flops 714, 715 would return to zero, which is not desired.

After the second flip-flops (714, 715) there are also third flip-flops (reference numerals 716, 717), which operate in the same manner as the second flip-flops. They detect if 4π is exceeded. This takes place when the outputs of the first flip-flop 705 (706 respectively) and the second flip-flop 714 (715 respectively) are up and a clock pulse arrives. The AND gate (718, 719) before them recognizes the situation where the previous flip-flops are up and the OR gate (720, 721) is required for the same purpose as in the case of the second flip-flops. By means of them the output pulse 734, 735 (ORUP/ORDOWN) remains up until it is separately reset.

The rest of the cells are associated with resetting. In this circuit, return to a normal range [−2π, 2π] takes place when it is returned below to any multiple of 2π. In other words, if 2π is exceeded and EXTUP, for instance, is up, a return to normal takes place if VCO pulse arrives prior to REF pulse. This applies also if 4π, 6π or 8π, etc., are exceeded. It means that any time the direction of the reference pulses changes, a return has been made below a multiple of 2π (or above a multiple of −2π). In this circuit solution, the normal range [−2π,2π] is then returned to.

The change in the directions of the reference pulses is detected when EXT output 732, 733 (EXTUP/EXTDOWN) is up, the corresponding reference output 730, 731 (UP/DOWN) is down and a clock pulse arrives in the opposite input. In other words, if EXTUP is up, UP is down and a pulse arrives in VCO input, the direction has changed. AND gates (722, 723), which follow the second flip-flops, detect if the preceding flip-flops are in above-described states. The clock inputs of the reset flip-flops (724, 725) are connected to outputs opposite to those of the preceding flip-flops (705, 706 and 714, 715). The outputs of the flip-flops 724 and 745 are reset pulses of extended operation. First they are inverted with inverters 726 and 727 so as to obtain correct polarity. Then the pulses are applied to resets of the second (714, 715) and the third (716, 717) flip-flops and also to the opposite first flip-flops (705, 706) through the above-mentioned AND gates (710, 711). This opposite first flip-flop has to be reset, because the arrived pulse handled the reset, i.e. it removed constant current from the opposite branch, and consequently reference current is no longer needed.

The circuit comprises yet one more set of delay cells (728, 729), in which the pulse arrives from the last reset flip-flops through the inverters (726, 727) and passes further to reset these reset flip-flops. The delay is required so that the length of the reset pulse is sufficient for resetting the reset flip-flops.

Figure 8:
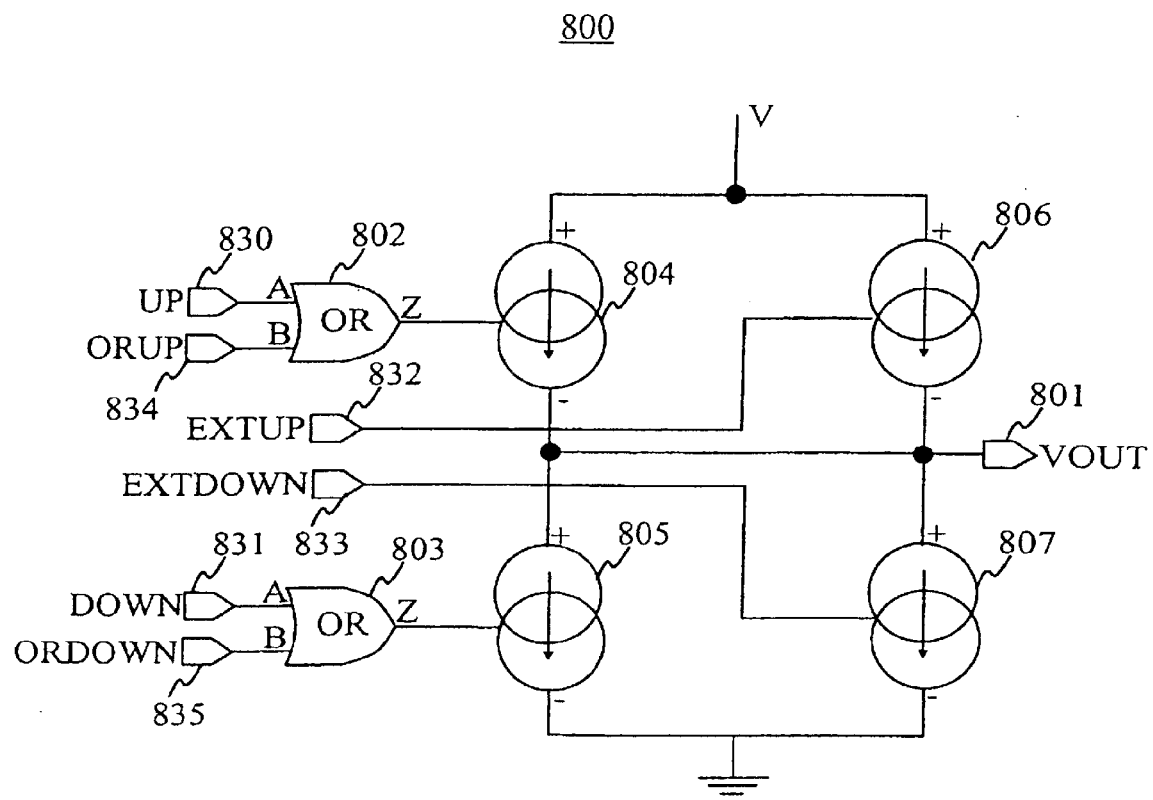
FIG. 8 is a block diagram of a charge pump of the invention.

FIG. 8 shows a charge pump device 800 according to the invention. The charge pump device comprises inputs 830, 831, 832, 833, 834 and 835 for receiving current pulses from the corresponding outputs 730, 731, 732, 733, 734 and 735 of the phase detector 700. The inputs 830 and 834 are controlled to inputs A and B of the OR gate 802, and output Z of said gate is controlled to a charge pump 804. The input 832 is controlled to a charge pump 806 and the input 833 is controlled to a charge pump 807. The inputs 831 and 835 are controlled to the inputs A and B of the OR gate 803 and the output Z of said gate is controlled to a charge pump 805.

The charge pumps 804 and 805 generate a control voltage VOUT when the phase difference between the signals to be compared is 0–2π. The charge pump 804 generates a positive control voltage at the output VOUT 801 in response to the signal of inputs 830 or 834. The charge pump 805 generates a negative control voltage at the output VOUT 801 in response to the signal of inputs 831 or 835. The charge pump 806 generates a positive control voltage at the output VOUT 801 in response to the signal of input 832. The charge pump 807 generates a negative control voltage at the output VOUT 801 in response to the signal of input 833.

The implementation and embodiments of the invention are described here by means of examples. It is apparent to a person skilled in the art that the invention is not restricted to the details of the above-described embodiments and that the invention can be implemented in a variety of ways without deviating from the characteristics of the invention. The described embodiments should be regarded as illustrative, not restrictive. The implementation and applications of the invention are only restricted by the accompanying claims. Thus, the various implementation alternatives of the invention defined in the claims, also equivalent implementations, are within the scope of the invention.

What is claimed is:

1. A method for reducing cycle slips in a frequency synthesizer, the frequency synthesizer comprising a voltage controlled oscillator for generating an output signal frequency, a divider for dividing said output signal into a signal pulse to be compared, a reference oscillator for generating a reference signal pulse and means for generating control voltage for the voltage controlled oscillator in response to a detected phase difference, which phase difference is the phase difference between the signal pulse to be compared and the reference signal pulse, and the method comprising the steps of receiving a first first-type signal pulse, the first-type signal pulse being either said reference signal pulse or said signal pulse to be compared, receiving a second second-type signal pulse, the second-type signal pulse being either said reference signal pulse or said signal pulse to be compared but of a different type than said first signal pulse, generating control voltage for controlling the voltage controlled oscillator in response to a phase difference between said first signal pulse and said second signal pulse, the magnitude of the phase difference being within the range of 0 to 2π, increasing the control voltage for a degree of constant voltage on receiving a third signal pulse of the first type before said second signal pulse, wherein in the method, reducing said control voltage for a degree of said constant voltage on receiving a fifth signal pulse of said second type after reception of the second signal pulse and before reception of a fourth signal pulse of the first type.

2. A method as claimed in claim 1, characterized by also receiving a sixth signal pulse of said first type after reception of said third signal pulse and before reception of said second signal pulse, and prior to adding said constant-degree voltage to said control voltage, the control voltage value is increased to its maximum and said control voltage is further increased for a degree of a constant voltage.

3. A method as claimed in claim 2, characterized by also receiving a seventh signal pulse of said second type after reception of said fifth signal pulse and before reception of said fourth signal pulse, and said added constant-degree voltage is reduced from said control voltage, and the maximum voltage is changed into a control voltage dependent on said phase difference.

4. A method as claimed in claim 3, wherein said control voltage maximum value is equal to the control voltage to be generated when the phase difference is 2π.

5. A method as claimed in claim 4, wherein said constant-degree voltage is equal to the control voltage to be generated when the phase difference is 2π.

6. A device for reducing cycle slips resulting from frequency hops in a communication device, which device comprises a voltage controlled oscillator for generating an output signal frequency, a divider for dividing said output signal into a signal pulse to be compared, a reference oscillator for generating a reference signal pulse, and a device comprises means for generating control voltage for the voltage controlled oscillator in response to a detected phase difference, the phase difference being a phase difference between the signal pulse to be compared and the reference signal pulse, and the device comprises receiving means for receiving a first first-type signal pulse, the first signal pulse being either said reference signal pulse or said signal pulse to be compared, receiving means for receiving a second second-type signal pulse, the second signal pulse being either said reference signal pulse or said signal pulse to be compared but of a different type than said first signal pulse, generating means for generating control voltage to control the voltage controlled oscillator in response to a phase difference between said first received signal pulse and said second received signal pulse, the magnitude of the phase difference being within the range of 0 to $2\pi$, adding means for adding a constant-degree voltage to said control voltage at a time instant between the reception of said first signal pulse and said second signal pulse, on receiving a third signal pulse of said first type before the second signal pulse, wherein the device further comprises removing means for reducing said constant-degree voltage from said control voltage a fifth signal pulse of said second type after reception of the second signal pulse and before reception of a fourth signal pulse of the first type.

7. A device as claimed in claim 6, wherein said device also comprises changing means for increasing said control voltage value to the maximum of said control voltage.

8. A device as claimed in claim 7, wherein said changing means are implemented to change said control voltage between the reception of said first-type signal pulse and said second-type signal pulse on receiving additionally at least one sixth signal pulse of said first type after reception of said third signal pulse and before reception of said second signal pulse.

9. A device as claimed in claim 8, wherein said changing means are also implemented to increase said control voltage for said constant-degree voltage.

10. A device as claimed in claim 6, wherein said removing means are also implemented to reduce said constant voltage from said control voltage and to change said control voltage from said maximum voltage to a voltage dependent on said phase difference.

11. A device as claimed in claim 9, wherein said device is a frequency synthesizer.

12. A wireless communication device comprising a device for reducing cycle slips resulting from frequency hops in said communication device, which device comprises a voltage controlled oscillator for generating an output signal frequency, a divider for dividing said output signal into a signal pulse to be compared, a reference oscillator for generating a reference signal pulse, and the device comprises means for generating a control voltage for the voltage controlled oscillator in response to a detected phase difference, the phase difference being a phase difference between the signal pulse to be compared and the reference signal pulse, and the device comprises receiving means for receiving a first signal pulse, the first signal pulse being either said reference signal pulse or said signal pulse to be compared, receiving means for receiving a second signal pulse, the second signal pulse being either said reference signal pulse or said signal pulse to be compared and of a different type than said first signal pulse, generating means for generating a control voltage for controlling the voltage controlled oscillator in response to a phase difference between said first signal pulse and said second signal pulse, the magnitude of the phase difference being within the range of 0 to $2\pi$, adding means for adding a constant-degree voltage to said control voltage between the reception of the said first signal pulse and said second signal pulse on receiving a third signal pulse of said first type before the second signal pulse, wherein the device further comprises removing means for reducing said constant-degree voltage from said control voltage after the reception of said second signal pulse on receiving a fifth signal pulse of said second type after reception of the second signal pulse and before reception of a fourth signal pulse of the first type.

13. A device as claimed in claim 10, wherein said device is a frequency synthesizer.

* * * * *